United States Patent
Filippi et al.

(10) Patent No.: US 9,524,916 B2
(45) Date of Patent: Dec. 20, 2016

(54) STRUCTURES AND METHODS FOR DETERMINING TDDB RELIABILITY AT REDUCED SPACINGS USING THE STRUCTURES

(71) Applicant: International Business Machines Corporation, Armonk, NY (US)

(72) Inventors: Ronald G. Filippi, Wappingers Falls, NY (US); Erdem Kaltalioglu, Newburgh, NY (US); Naftali E. Lustig, Croton on Hudson, NY (US); Ping-Chuan Wang, Hopewell Junction, NY (US); Lijuan Zhang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 853 days.

(21) Appl. No.: 13/664,903

(22) Filed: Oct. 31, 2012

(65) Prior Publication Data

US 2014/0118020 A1  May 1, 2014

(51) Int. Cl.
*H01L 21/66* (2006.01)
*G01R 31/28* (2006.01)

(52) U.S. Cl.
CPC .......... *H01L 22/34* (2013.01); *G01R 31/2884* (2013.01); *H01L 2224/45099* (2013.01); *H01L 2224/48091* (2013.01); *H01L 2224/48227* (2013.01); *H01L 2224/48465* (2013.01); *H01L 2924/00014* (2013.01); *H01L 2924/15311* (2013.01)

(58) Field of Classification Search
CPC ...... G01R 31/2884; H01L 22/34; H01L 23/48; H01L 2224/48227; H01L 2924/15311; H01L 2924/00014; H01L 2224/48465; H01L 2224/48091; H01L 2924/00; H01L 224/48091
USPC .............. 324/324, 762.01; 257/774, E23.011
IPC ................ G01R 31/2884; H01L 22/34, 23/48, 2224/48227, 2924/15311, 2924/00014, 2224/48465, 2224/48091, 2924/00, 224/48091
See application file for complete search history.

(56) References Cited

U.S. PATENT DOCUMENTS

| 5,451,543 | A | * | 9/1995 | Woo et al. ..................... 438/637 |
| 5,598,027 | A | * | 1/1997 | Matsuura .......... H01L 21/76807 257/632 |
| 6,015,751 | A | * | 1/2000 | Liu .................... H01L 21/76802 257/E21.577 |
| 6,967,499 | B1 | * | 11/2005 | Haase et al. .............. 324/762.03 |
| 7,616,021 | B2 | | 11/2009 | Papageorgiou et al. |
| 7,673,262 | B2 | | 3/2010 | Stine et al. |
| 7,759,957 | B2 | | 7/2010 | Ko et al. |
| 7,851,793 | B2 | | 12/2010 | Wang et al. |

(Continued)

*Primary Examiner* — Melissa Koval
*Assistant Examiner* — Courtney McDonnough
(74) *Attorney, Agent, or Firm* — Schmeiser, Olsen & Watts; Steve Meyers

(57) ABSTRACT

A structure for TDDB measurement, a method determining TDDB at reduced spacings. The structure includes an upper dielectric layer on a top surface of a lower dielectric layer, a bottom surface of the upper dielectric layer and the top surface of the lower dielectric layer defining an interface; a first wire formed in the lower dielectric layer; a second wire formed in the upper dielectric layer; and wherein a distance between the first wire and the second wire measured in a direction parallel to the interface is below the lithographic resolution limit of the fabrication technology.

23 Claims, 8 Drawing Sheets

(56) References Cited

U.S. PATENT DOCUMENTS

| | | | |
|---|---|---|---|
| 8,001,516 B2 | 8/2011 | Smith et al. | |
| 2003/0207561 A1* | 11/2003 | Dubin | H01L 21/288 438/630 |
| 2007/0000688 A1* | 1/2007 | Mobley | H01L 21/4857 174/255 |
| 2007/0278681 A1* | 12/2007 | Yu | H01L 21/76807 257/758 |
| 2007/0296444 A1* | 12/2007 | Zhu | G01R 31/2884 324/755.01 |
| 2008/0017857 A1* | 1/2008 | Adkisson | H01L 22/20 257/48 |
| 2009/0027074 A1* | 1/2009 | Ko | G01R 31/2875 324/750.11 |
| 2009/0311491 A1* | 12/2009 | Huang | G03F 7/70466 428/195.1 |
| 2010/0044869 A1* | 2/2010 | Zhang et al. | 257/773 |
| 2010/0187693 A1* | 7/2010 | Mountsier et al. | 257/751 |
| 2011/0156858 A1 | 6/2011 | Poppe et al. | |

* cited by examiner

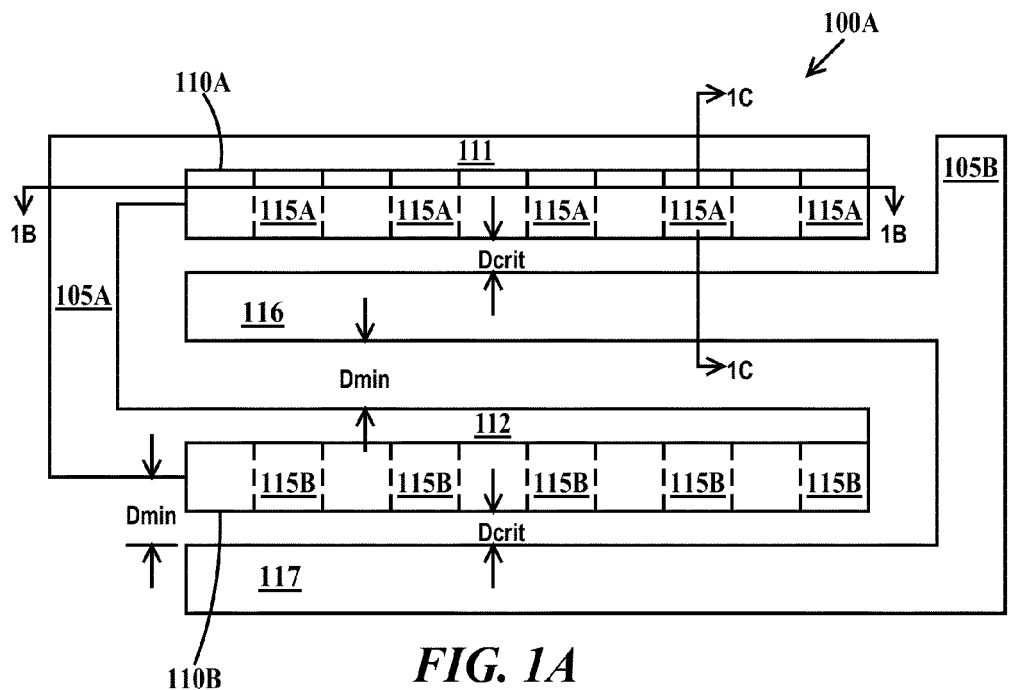
*FIG. 1A*
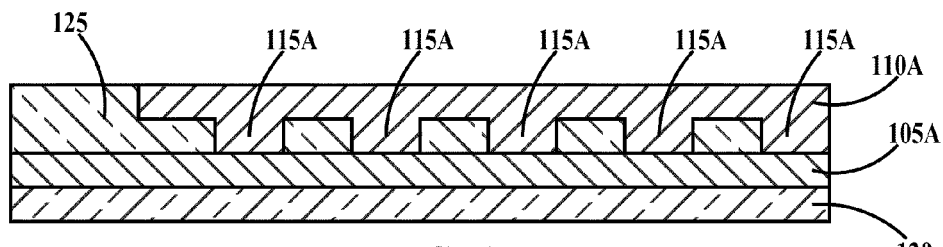
*FIG. 1B*
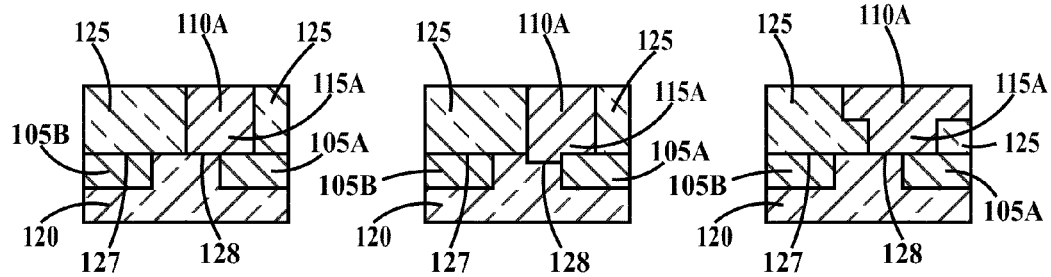
*FIG. 1C*  *FIG. 1D*  *FIG. 1E*

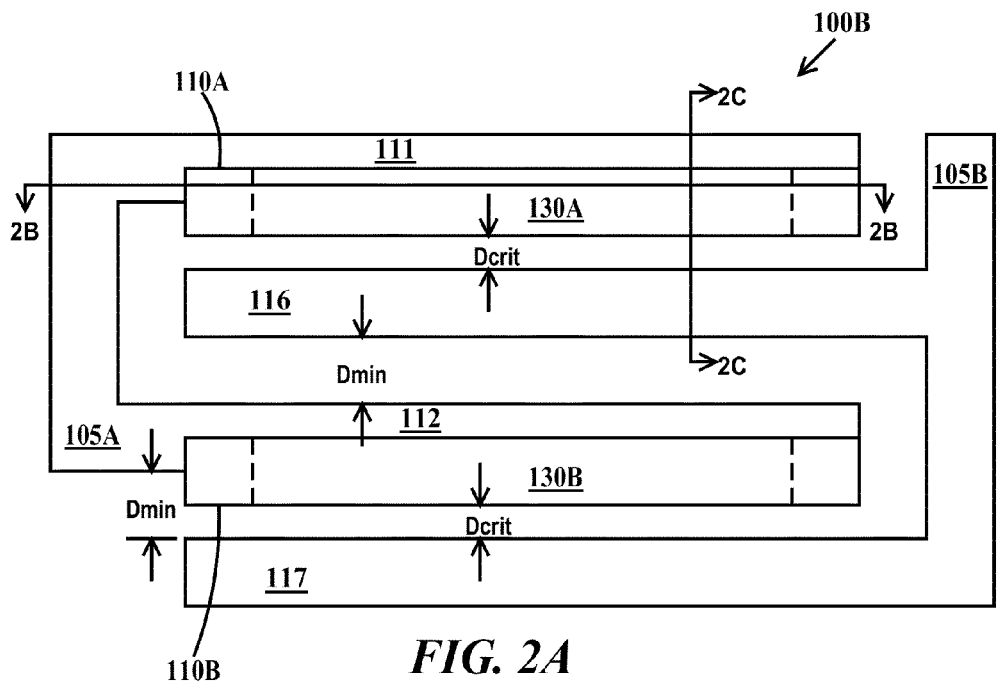
FIG. 2A
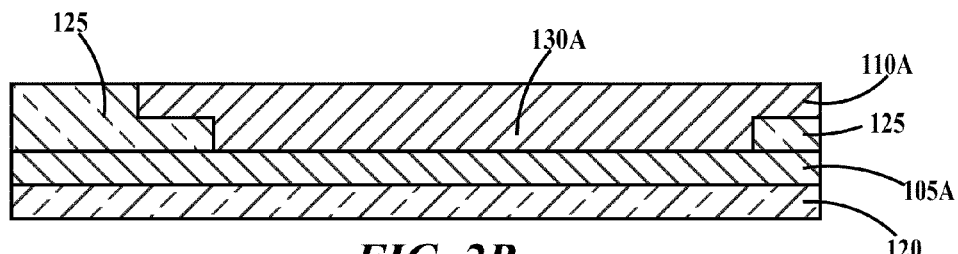
FIG. 2B
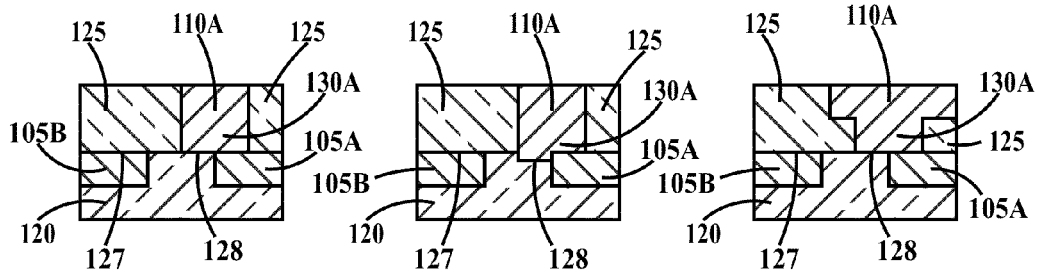
FIG. 2C     FIG. 2D     FIG. 2E

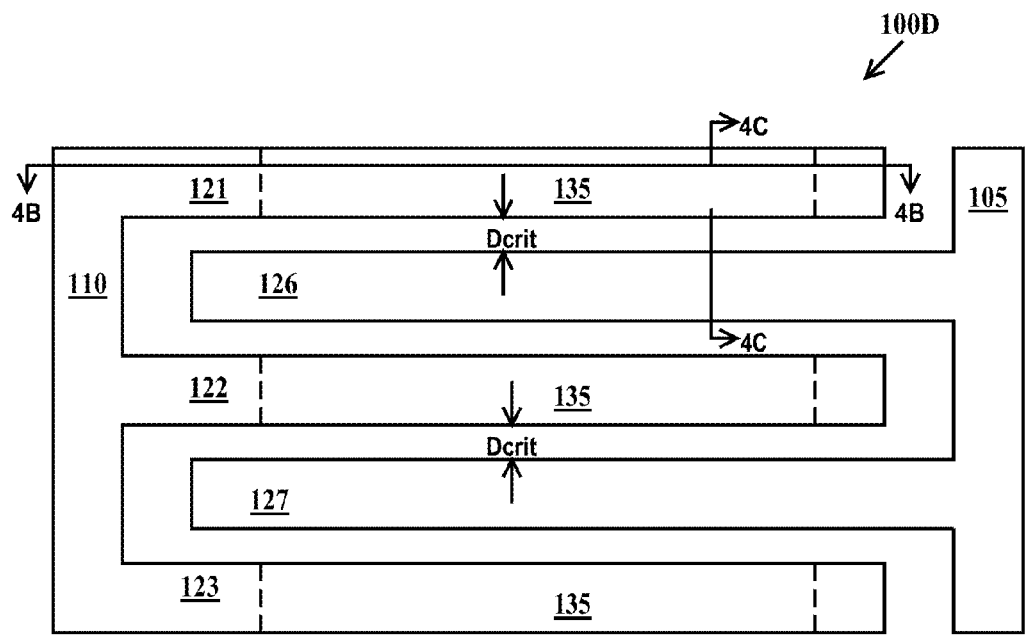
*FIG. 4A*
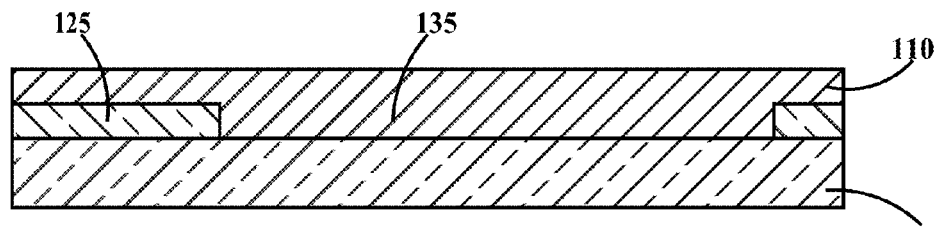
*FIG. 4B*
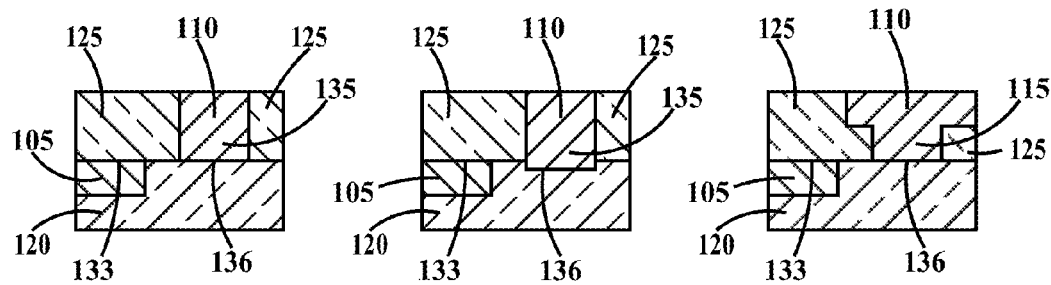
*FIG. 4C*  *FIG. 4D*  *FIG. 4E*

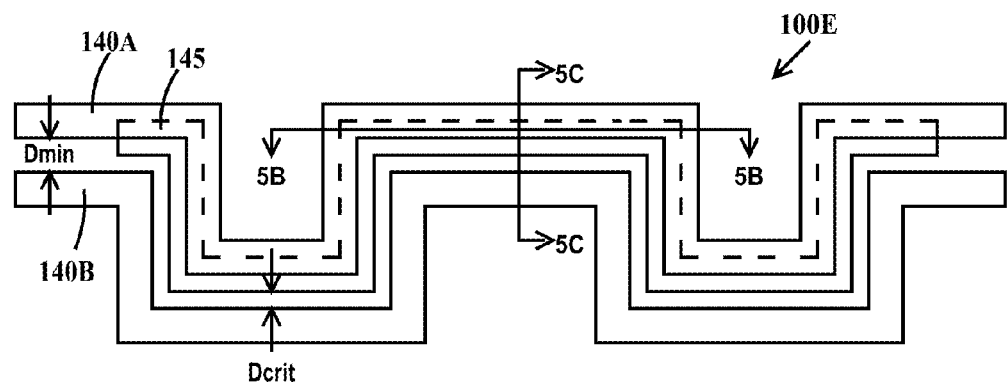
*FIG. 5A*
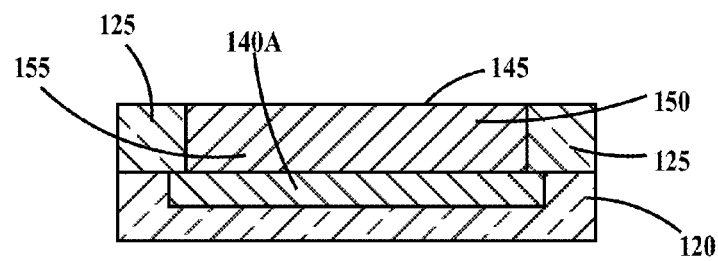
*FIG. 5B*
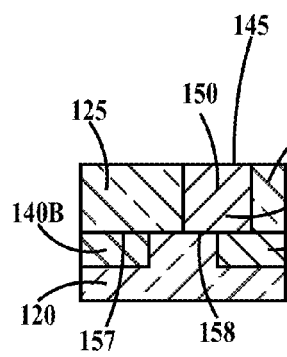 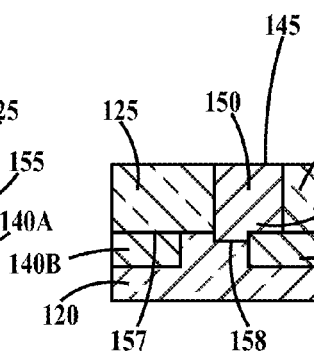 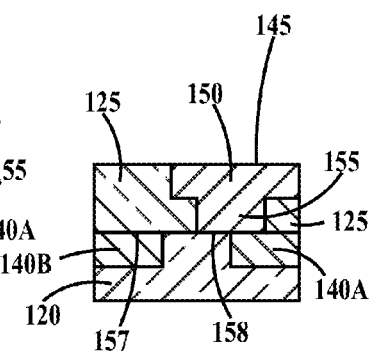
*FIG. 5C*   *FIG. 5D*   *FIG. 5E*

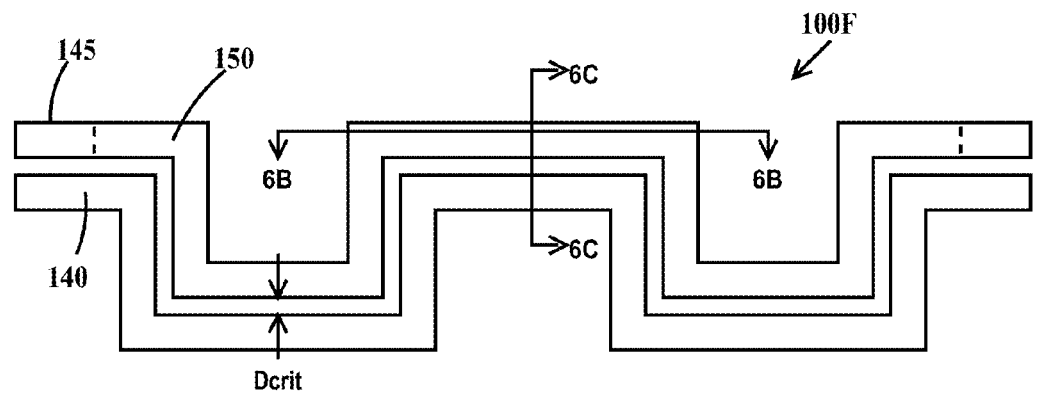
*FIG. 6A*
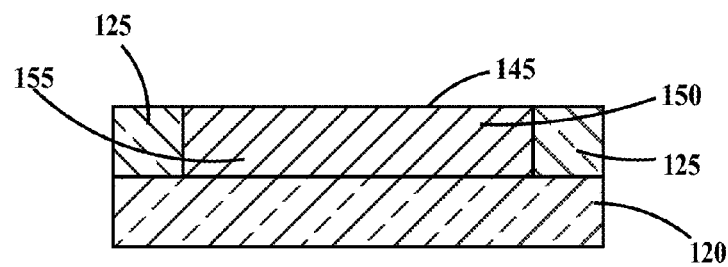
*FIG. 6B*
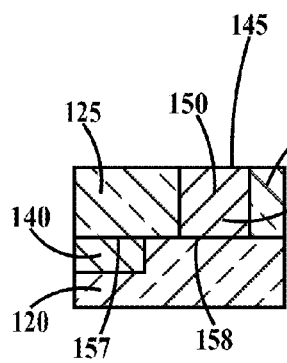 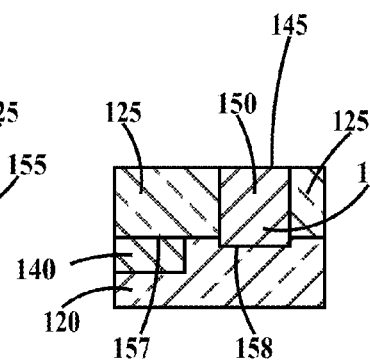 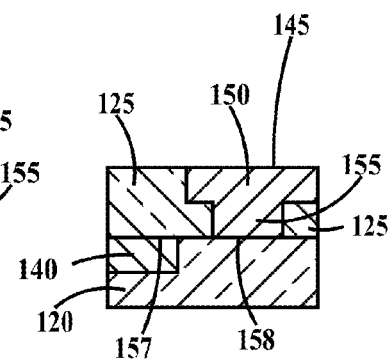
*FIG. 6C*     *FIG. 6D*     *FIG. 6E*

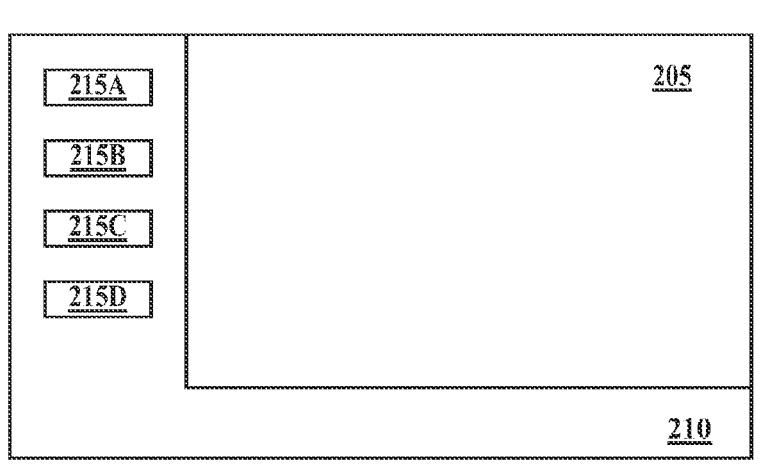
FIG. 7A
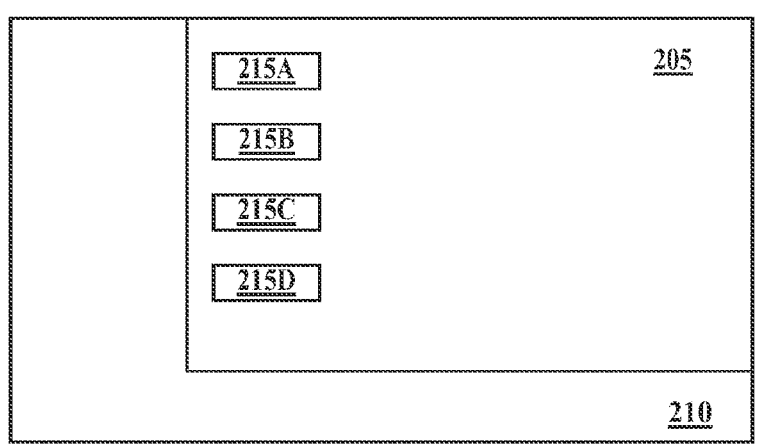
FIG. 7B
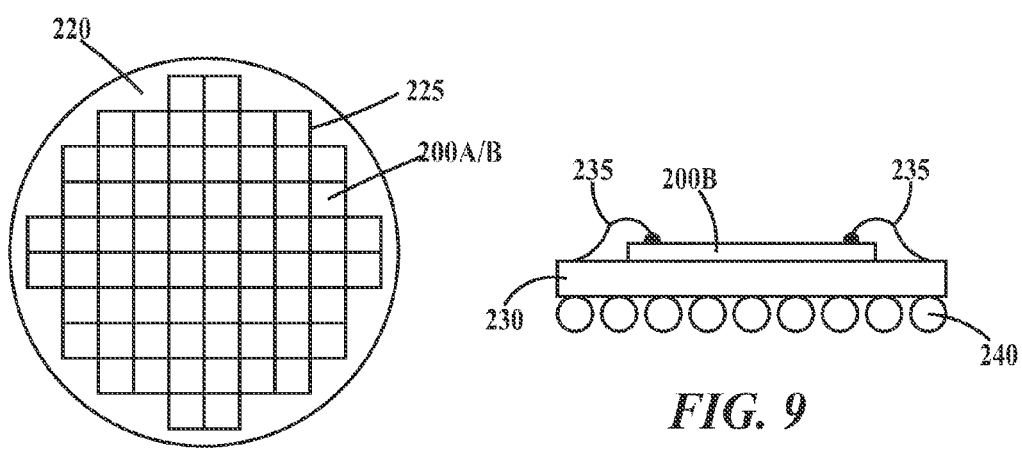
FIG. 8
FIG. 9

STRUCTURES AND METHODS FOR DETERMINING TDDB RELIABILITY AT REDUCED SPACINGS USING THE STRUCTURES

TECHNICAL FIELD

The present invention relates to the field of time dependent dielectric breakdown (TDDB) of integrated circuit reliability; more specifically, it relates to structures and methods for determining TDDB reliability at reduced spacings using the structures.

BACKGROUND

As the dimensions of integrated circuit features decreases, determining TDDB behavior (which is critical to integrated circuit reliability, at wire-to-wire spacings below the minimum spacing allowed by the lithographical process used to define wires in a same wiring level) using current measurement structures and methods have become more unreliable. Accordingly, there exists a need in the art to mitigate the deficiencies and limitations described hereinabove.

BRIEF SUMMARY

A first aspect of the present invention is a structure, comprising: an upper dielectric layer on a top surface of a lower dielectric layer, a bottom surface of the upper dielectric layer and the top surface of the lower dielectric layer defining an interface; a first wire formed in the lower dielectric layer; a second wire formed in the upper dielectric layer; and wherein a distance between the first wire and the second wire measured in a direction parallel to the interface is below a minimum allowed wire-to-wire spacing in the lower dielectric layer.

A second aspect of the present invention is a method, comprising: providing two or more TDDB test structures, each TDDB test structure comprising: an upper dielectric layer on a top surface of a lower dielectric layer, a bottom surface of the upper dielectric layer and the top surface of the lower dielectric layer defining an interface; a first conductor formed in the lower dielectric layer; a second conductor formed in the upper dielectric layer; and wherein a distance between the first conductor and the second conductor measured in a direction parallel to the interface is below the resolution limit of the lithographical process used to define conductor-to conductor distanced in the lower dielectric layer; each of the two or more TDDB test structure having a different first conductor to second conductor distance; stressing the TDDB test structures at a preselected temperature with an electric field applied between the first and second conductors, measuring a leakage current between the first and second conductors, and recording a time for each TDDB test structure of the two or more TDDB test structures to exceed a preselected leakage current value; and extrapolating a time to fail of a TDDB test structure having a first conductor to second conductor distance that is less than the smallest distance of the different first conductor to second conductor distances.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIGS. 1A through 1E illustrate a first TDDB test structure according to the present invention;

FIGS. 2A through 2E illustrate a second TDDB test structure according to the present invention;

FIGS. 4A through 4E illustrate a fourth TDDB test structure according to the present invention;

FIGS. 5A through 5E illustrate a fifth TDDB test structure according to the present invention;

FIGS. 6A through 6E illustrate a sixth TDDB test structure according to the present invention;

FIGS. 7A and 7B illustrate placement of TDDB test structures according to embodiments of the present invention in integrated circuit chips;

FIG. 8 illustrates an un-singulated wafer containing integrated circuit chips having TDDB test structures according to embodiments of the present invention;

FIG. 9 illustrates an integrated circuit chip having TDDB test structures according to embodiments of the present invention mounted to a module;

DETAILED DESCRIPTION

Figure 3A:
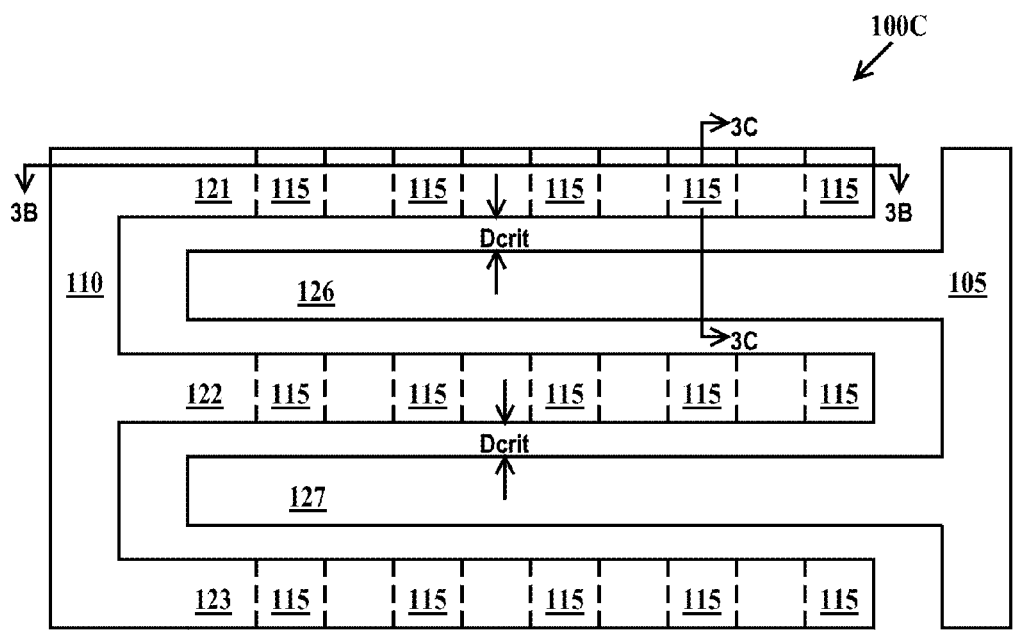
FIGS. 3A through 3E illustrate a third TDDB test structure according to the present invention.

Time dependent dielectric breakdown is a breakdown that can occur along an interface (rather than through the bulk dielectric) of two dielectric layers between two conductors spaced apart. TDDB results in a TDDB leakage current. TDDB leakage current is an indicator of adjacent wire-to-wire leakage that can occur during or as a result of normal operation of the integrated circuit over its lifetime and is a reliability indicator.

Dmin is defined as the minimum allowed designed wire-to-wire spacing in the same wiring level and is the lithographic resolution limit of the fabricating technology. MinIns is defined as the minimum conductor-to-conductor (e.g., wire-to wire or wire-to-via) spacing in the same wiring level that can actually occur in a physical integrated circuit due to process variations.

The TDDB test structures of the embodiments of the present invention utilize vias or via bars of an upper wire in an upper dielectric layer placed within a horizontal distance of a lower wire in a lower and abutting dielectric layer, wherein the distance is below the lithographic resolution limit of the fabricating technology.

A damascene process is one in which wire trenches or via openings are formed in a dielectric layer, an electrical conductor of sufficient thickness to fill the trenches is formed in the trenches and on a top surface of the dielectric. The topographic dimensions of the trenches are defined by a lithographic/etch process. A chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A via first dual-damascene process is one in which via openings are formed through the entire thickness of a dielectric layer followed by formation of trenches part of the way through the dielectric layer in any given cross-sectional view. A trench first dual-damascene process is one in which trenches are formed part way through the thickness of a dielectric layer followed by formation of vias inside the trenches the rest of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is formed on a top surface of the dielectric and a CMP process is performed to make the surface of the conductor in the trench co-planar with the surface of the dielectric layer to form dual-damascene wires and dual-damascene wires having integral dual-damascene vias.

When viewed from the top, a via has a width about equal to its length (e.g., a square). When viewed from the top, a via that has a length of at least about 1.5 times greater than its width (e.g., a rectangle) the via is called a via bar. The term via is defined as a via that has a width about equal to its length. The term via bar is defined as a via bar that has a length of at least about 1.5 times greater than its width. Those skilled in the art will recognize that the corners of vias and via bars may become rounded when formed. Vias may actually become circular when formed.

Vias may be partially landed on a wire in the abutting lower dielectric layer or un-landed (i.e., not landed) on any wire formed in the abutting lower dielectric layer. As opposed to a fully landed via where the entire bottom surface of the via touches a top surface of the lower wire, in a partially landed via a less than whole portion of the bottom surface of the via touches the top surface of the lower wire.

Integrated circuits comprise various devices, such as field effect transistors (FETs) formed in the substrate and wires formed in wiring levels above the substrate that interconnect the devices into circuits. There are multiple wiring levels, each comprised of a wire formed in an interlevel dielectric layer. The upper wires are connected to immediately lower adjacent wires by vias. Wiring levels are identified using the designation X where X is a positive integer from 1 to N. The wiring levels are identified from the wiring level closest to the substrate to the wiring level furthest from the substrate as 1 through N where 1 is the first or lowermost wiring level and N is the last or uppermost wiring level. Wires, vias and via bars are similarly designated. A wire in the X wiring level is designated as an MX wire. A via in the X wiring level is designated as a VX−1 via. A via bar in the X wiring level is designated as a VX−1 via bar. Note that there are no V0 vias or via bars. When a wire in an upper wiring level is designated MX, then a wire in an immediately lower wiring level is designated MX−1. Likewise, when a wire in a lower wiring level is designated MX, then a wire in an immediately higher wiring level is designated MX+1. For a first wiring level (X=1), the wire is M1 and there are no "V0" vias or via bars as generally the connection from M1 to devices below M1 is made through separately formed contacts in a contact layer designated CA. For a second wiring level (X=2), the wire is M2 and the vias or via bars are V1. For a third wiring level (X=3), the wire is M3 and the vias or via bars are V2. All wires described in the monitor structures described infra are either single-damascene wires (for X=1) or dual-damascene wires for X=2 or greater.

Similar structures in the various embodiments will use the same reference numbers in order to emphasize the similarities and differences between embodiments.

FIGS. 1A through 1E illustrate a first TDDB test structure according to the present invention. FIG. 1A is a top view, FIG. 1B is a cross-sectional view through line 1B-1B of FIG. 1A and FIG. 1C is a cross-sectional view through line 1C-1C of FIG. 1A. In FIG. 1A, a TDDB test structure 100A includes a first MX wire 105A, a second MX wire 105B, a first MX+1 wire 110A and a second MX+1 wire 110B. First MX+1 wire 110A includes multiple integrally formed VX vias 115A that are in direct physical and electrical contact with first MX wire 105A. Second MX+1 wire 110B includes multiple integrally formed VX vias 115B that are in direct physical and electrical contact with first MX wire 105A. First MX wire 105A has fingers 111 and 112 that are interdigitated with fingers 116 and 117 of second MX wire 105B. Finger of 116 of second MX wire 105B is spaced a distance Dmin from finger 112 of first MX wire 105A. Finger of 112 of first MX wire 105A is spaced distance Dmin from finger 117 of second MX wire 105B. VX vias 115A are not fully landed on first MX wire 105A (they are offset towards the fingers of second MX wire 105B) and are spaced a distance Dcrit from the adjacent finger of second MX wire 105B. VX vias 115B are not fully landed on first MX wire 105A (they are offset towards the adjacent finger of second MX wire 105B) and are spaced a distance Dcrit from the adjacent finger of second MX wire 105B.

From FIGS. 1B and 1C, it can be seen that MX wires 105A and 105B are formed in a lower dielectric layer 120 and MX+1 wire 110A (also wire 110B, not shown) and VX vias 115A (also vias 115B) are formed in an upper dielectric layer 125. In FIG. 1C, a top surface 127 of second MX wire 105B is coplanar with bottom surfaces 128 of VX vias 115A. Dcrit is the distance between second MX wire 105B and VX vias 115A along the interface between lower dielectric layer 120 and upper dielectric layer 125. The distance between second MX wire 105B and VX vias 115B (not shown in FIG. 1C) along the interface between lower dielectric layer 120 and upper dielectric layer 125 is also Dcrit.

The dielectric materials and electrical conductors of wires, vias and via bars of the TDDB structures are the same as the normal materials used in wiring the active devices.

Exemplary materials for lower dielectric layer 120 and upper dielectric layer 125 include but are not limited to silicon dioxide ($SiO_2$), silicon nitride ($Si_3N_4$), silicon carbide (SiC), silicon oxy nitride (SiON), silicon oxy carbide (SiOC) plasma-enhanced silicon nitride ($PSiN_x$) or NBLock (SiC(N,H)). Exemplary low K (dielectric constant) materials having a relative permittivity of about 4 or less, for lower dielectric layer 120 and upper dielectric layer 125 include but are not limited to hydrogen silsesquioxane polymer (HSQ), methyl silsesquioxane polymer (MSQ), polyphenylene oligomer, methyl doped silica or $SiO_x(CH_3)_y$, or $SiC_xO_yH_y$, or SiOCH, organosilicate glass (SiCOH), and porous SiCOH, fluorinated $SiO_2$ (FSG) and porous $SiO_2$.

Figure 12:
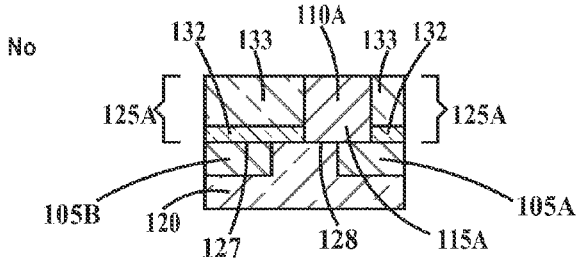
FIG. 12 illustrates embodiments of the present invention that utilize a dual layer dielectric.

When dielectric layers 120 and 125 comprise multiple dielectric layers, the interface of interest is the interface between the uppermost dielectric layer of lower dielectric layer 120 and the lowermost dielectric layer of upper dielectric layer 125 as illustrated in FIG. 12, which is exemplary for all embodiments of the present invention. In FIG. 12, upper dielectric layer 125A comprises a bottom dielectric layer 132 and a top dielectric layer 133. The interface of interest is the interface between lower dielectric layer 120 and bottom dielectric layer 132. Examples of materials for bottom dielectric layer 132 include, but are not limited to, $Si_3N_4$, SiC and SiC(N,H). Examples of materials for top dielectric layer 133 include nonporous $SiO_2$ and low K (dielectric constant) materials having a relative permittivity of about 4 or less, examples of which include but are not limited to HSQ, MSQ, polyphenylene oligomer, $SiO_x$ $(CH_3)_y$, $SiC_xO_yH_y$, SiOCH, SiCOH, porous SiCOH, porous $SiO_2$ and FSG.

Examples of electrically conductive materials for wires, vias and via-bars of the embodiments of the present invention include aluminum (Al), copper (Cu), tungsten (W), titanium (Ti), titanium nitride (TiN), tantalum (Ta) and tantalum nitride (TaN) and particularly wires (and the integral vias or via bars) comprising a copper core and a liner of TaN/Ta or TiN/Ti.

FIG. 1D illustrates a variation of FIG. 1C wherein VX vias 115A extend into lower dielectric layer 120 so top surface 127 of second MX wire 105B is not coplanar with bottom surfaces 128 of VX vias 115A. However, Dcrit is still measured along the interface between lower dielectric layer 120 and upper dielectric layer 125. FIG. 1E illustrates a variation of first and second MX+1 wires 110A and 110B. In FIGS. 1A and 1C, the widths of first MX+1 wire 110A and VX vias 115A are the same, while in FIG. 1E the width of first MX+1 wire 110A is greater than the widths of VX vias 115A. Dcrit is still measured along the interface between lower dielectric layer 120 and upper dielectric layer 125.

Dmin and MinIns have been defined supra. For 22 nm technology, Dmin is about 40 nm and MinIns is about 12 nm and values that can be obtained for Dcrit range from about 40 nm to about 20 nm. In other words, Dcrit can range between about Dmin and about 0.5×Dmin or less. In order to estimate the TDDB behavior of an integrated circuit at MinIns, a series of measurement structures 100A (and 100B, 100C, 100D, 100E and 100F described infra) with values of Dcrit ranging from about Dmin to about 0.5×Dmin or less are fabricated. The structures are stressed, and the data extrapolated to MinIns. Also, there may be sets of measurement structures built in different pairs of adjacent wiring levels and Dmin and MinIns may vary from set to set.

FIGS. 2A through 2E illustrate a second TDDB test structure according to the present invention. FIGS. 2A through 2F are similar to FIGS. 1A through 1E except vias 115A and 115B of FIGS. 1A through 1E are replaced with via bars 130A and 130B respectively. FIG. 2A is a top view, FIG. 2B is a cross-sectional view through line 2B-2B of FIG. 2A and FIG. 2C is a cross-sectional view through line 2C-2C of FIG. 2A. In FIG. 2A, a TDDB test structure 100B includes a first MX wire 105A, a second MX wire 105B, a first MX+1 wire 110A and a second MX+1 wire 110B. First MX+1 wire 110A includes an integrally formed VX via bar 130A that is in direct physical and electrical contact with first MX wire 105A. Second MX+1 wire 110B includes an integrally formed VX via bar 130B that is in direct physical and electrical contact with first MX wire 105A. First MX wire 105A has fingers 111 and 112 that are interdigitated with fingers 116 and 117 of second MX wire 105B. Finger of 116 of second MX wire 105B is spaced a distance Dmin from finger 112 of first MX wire 105A. Finger of 112 of first MX wire 105A is spaced distance Dmin from finger 117 of second MX wire 105B. VX via bar 130A is not fully landed on first MX wire 105A (it is offset towards the fingers of second MX wire 105B) and is spaced a distance Dcrit from the adjacent finger of second MX wire 105B. VX via bar 130B is not fully landed on first MX wire 105A (it is offset towards the adjacent finger of second MX wire 105B) and are spaced distance Dcrit from the adjacent finger of second MX wire 105B.

From FIGS. 2B and 2C, it can be seen that MX wires 105A and 105B are formed in lower dielectric layer 120 and MX+1 wire 110A (also wire 110B, not shown) and VX via bar 130A (also via bar 130B) is formed in an upper dielectric layer 125. In FIG. 2C, a top surface 127 of second MX wire 105B is coplanar with a bottom surfaces 128 of VX via bar 130A. Dcrit is the distance between second MX wire 105B and VX via bar 130A along the interface between lower dielectric layer 120 and upper dielectric layer 125. The distance between second MX wire 105B and VX via bar 130B (not shown in FIG. 2C) along the interface between lower dielectric layer 120 and upper dielectric layer 125 is also Dcrit.

FIG. 2D illustrates a variation of FIG. 2C wherein VX via bar 130A extends into lower dielectric layer 120 so top surface 127 of second MX wire 105B is not coplanar with bottom surfaces 128 of VX via bar 130A. However, Dcrit is still measured along the interface between lower dielectric layer 120 and upper dielectric layer 125. FIG. 2E illustrates a variation of first and second MX+1 wires 110A and 110B. In FIGS. 2A and 2C, the widths of first MX+1 wire 110A and VX via bar 130A are the same, while in FIG. 2E the width of first MX+1 wire 110A is greater than the width of VX via bar 130A. Dcrit is still measured along the interface between lower dielectric layer 120 and upper dielectric layer 125.

Figure 3B:
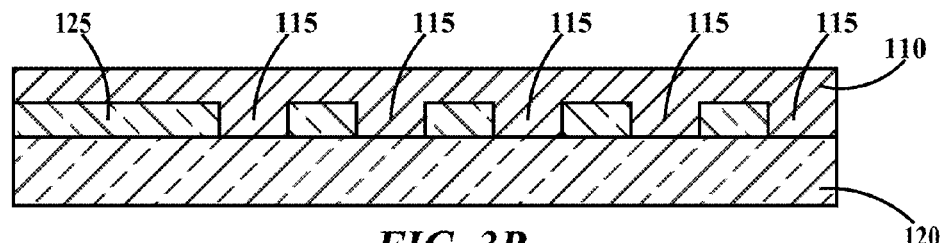
Figures 3C, 3D, 3E:
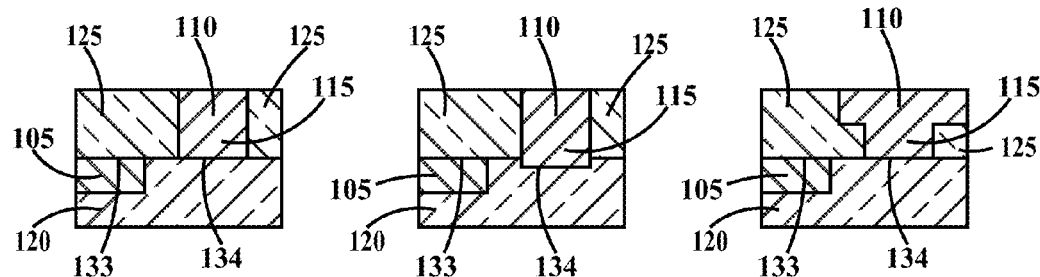

FIGS. 3A through 3E illustrate a third TDDB test structure according to the present invention. FIGS. 3A through 1E are similar to FIGS. 1A through 1E except MX wires 105A and 105B of FIGS. 1A through 1E are replaced with a single MX wire 105, MX+1 wires 110A and 110B are replaced with a single MX+1 wire 110, VX vias 115A and 115B are replaced by three sets of VX vias 115 and the VX vias 115 are un-landed. FIG. 3A is a top view, FIG. 3B is a cross-sectional view through line 3B-3B of FIG. 3A and FIG. 3C is a cross-sectional view through line 3C-3C of FIG. 3A. In FIG. 3A, a TDDB test structure 100C includes an MX wire 105, an MX+1 wire 110. MX+1 wire 110 includes multiple integrally formed VX vias 115 that are not in direct physical and electrical contact with any MX wire. MX wire 105 has fingers 126 and 127 that are interdigitated with fingers 121, 122 and 123 of MX+1 wire 110. Finger 126 of MX wire 105 is spaced a distance Dcrit from VX vias 115 of finger 121 of MX+1 wire 110. Finger 127 of MX wire 105 is spaced a distance Dcrit from VX vias 115 of finger 122 of MX+1 wire 110.

From FIGS. 3B and 3C, it can be seen that MX wire 105 is formed in lower dielectric layer 120 and MX+1 wire 110 and VX vias 115 are formed in upper dielectric layer 125. In FIG. 3C, a top surface 133 of MX wire 105 is coplanar with bottom surfaces 134 of VX vias 115. Dcrit is the distance between MX wire 105 and VX vias 115 along the interface between lower dielectric layer 120 and upper dielectric layer 125.

FIG. 3E illustrates a variation of FIG. 3C wherein VX vias 115 extend into lower dielectric layer 120 so top surface 133 of MX wire 105 is not coplanar with bottom surfaces 134 of VX vias 115. However, Dcrit is still measured along the interface between lower dielectric layer 120 and upper dielectric layer 125. FIG. 3E illustrates a variation of MX+1 wire 110. In FIGS. 3A and 3C, the widths of MX+1 wire 110 and VX vias 115 are the same, while in FIG. 3E the width of MX+1 wire 110 is greater than the widths of VX vias 115. Dcrit is still measured along the interface between lower dielectric layer 120 and upper dielectric layer 125.

FIGS. 4A through 4E illustrate a fourth TDDB test structure according to the present invention. FIGS. 4A through 4E are similar to FIGS. 3A through 3E except the three sets of MX vias 115 of FIGS. 3A through 3E are replaced with three VX via bars 135 and the VX via bars 135 are un-landed. FIG. 4A is a top view, FIG. 4B is a cross-sectional view through line 4B-4B of FIG. 4A and FIG. 4C is a cross-sectional view through line 4C-4C of FIG. 4A. In FIG. 4A, a TDDB test structure 100D includes MX wire 105, MX+1 wire 110. MX+1 wire 110 includes three integrally formed VX via bars 135 (one VX via bar on each of fingers 121, 122 and 123) that are not in direct physical and electrical contact with any MX wire. MX wire 105 has fingers 126 and 127 that are interdigitated with fingers 121, 122 and 123 of MX+1 wire 110. Finger 126 of MX wire 105 is spaced a distance Dcrit from VX via bar 135 of finger 121 of MX+1 wire 110. Finger 127 of MX wire 105 is spaced a distance Dcrit from VX via bar 135 of finger 122 of MX+1 wire 110.

From FIGS. 4B and 4C, it can be seen that MX wire 105 is formed in lower dielectric layer 120 and MX+1 wire 110 and VX via bars 135 are formed in upper dielectric layer 125. In FIG. 4C, a top surface 133 of MX wire 105 is coplanar with bottom surfaces 136 of VX via bars 135. Dcrit is the distance between MX wire 105 and VX via bars 135 along the interface between lower dielectric layer 120 and upper dielectric layer 125.

FIG. 4D illustrates a variation of FIG. 4C wherein VX via bars 135 extend into lower dielectric layer 120 so top surface 133 of MX wire 105 is not coplanar with bottom surfaces 136 of VX via bars 135. However, Dcrit is still measured along the interface between lower dielectric layer 120 and upper dielectric layer 125. FIG. 4E illustrates a variation of MX+1 wire 110. In FIGS. 4A and 4C, the widths of MX+1 wire 110 and VX via bars 135 are the same, while in FIG. 4E the width of MX+1 wire 110 is greater than the widths of VX via bars 135. Dcrit is still measured along the interface between lower dielectric layer 120 and upper dielectric layer 125.

FIGS. 5A through 5E illustrate a fifth TDDB test structure according to the present invention. FIG. 5A is a top view, FIG. 5B is a cross-sectional view through line 5B-5B of FIG. 5A and FIG. 5C is a cross-sectional view through line 5C-5C of FIG. 5A. In FIG. 5A, a TDDB test structure 100E includes a first serpentine MX wire 140A, a second serpentine MX wire 140B and a serpentine MX+1 wire 145. MX+1 wire 145 includes a serpentine wire portion 150 and an integrally formed serpentine Via bar portion 155 that is partially landed on first MX wire 140A along the entire length of VX via bar 155. First MX wire 140A is spaced distance Dmin from second MX wire 140B along an entire length of second MX wire 140B directly contacted by via bar portion 155 of MX+1 wire 145. MX+1 wire 145 (including wire portion 150 and Via bar portion 155) is offset toward second MX wire 140B. The entire length of via bar portion 155 of MX+1 wire 145 is spaced a distance Dcrit from second MX wire 140B.

From FIGS. 5B and 5C, it can be seen that MX wire 140A and 140B are formed in lower dielectric layer 120 and MX+1 wire 145 (including wire portion 150 and via bar portion 155) is formed in upper dielectric layer 125. In FIG. 5C, a top surface 157 of second MX wire 140B is coplanar with a bottom surface 158 of via bar portion 155 of MX+1 wire 145. Dcrit is the distance between second MX wire 140B and via bar portion 155 of MX+1 wire 145 along the interface between lower dielectric layer 120 and upper dielectric layer 125. When dielectric layers 120 and 125 comprise multiple dielectric layers, the interface of interest is the interface between the uppermost dielectric layer of lower dielectric layer 120 and the lowermost dielectric layer of upper dielectric layer 125.

FIG. 5D illustrates a variation of FIG. 5C wherein Via bar portion 155 of MX+1 wire 145 extends into lower dielectric layer 120 so top surface 157 of second MX wire 140B is not coplanar with bottom surface 158 of via bar portion 155 of MX+1 wire 145. However, Dcrit is still measured along the interface between lower dielectric layer 120 and upper dielectric layer 125. FIG. 5E illustrates a variation of MX+1 wires 145. In FIGS. 5A and 5C, the widths of wire portion 150 and via bar portion 155 of MX+1 wire 145 are the same, while in FIG. 5E the width of wire portion 150 is greater than the width of via bar portion 155 of MX+1 wire 145. Dcrit is still measured along the interface between lower dielectric layer 120 and upper dielectric layer 125.

FIGS. 6A through 6E illustrate a sixth TDDB test structure according to the present invention. FIG. 6A is a top view, FIG. 6B is a cross-sectional view through line 6B-6B of FIG. 6A and FIG. 6C is a cross-sectional view through line 6C-6C of FIG. 6A. FIGS. 6A through 6E are similar to FIGS. 5A through 5E except there is no first MX wire 140A and consequently via bar portion 155 of MX+1 wire 145 is un-landed and second MX wire 140A is now designated MX wire 140. In FIG. 6A, a TDDB test structure 100F includes serpentine MX wire 140, and serpentine MX+1 wire 145. MX+1 wire 145 includes serpentine wire portion 150 and integrally formed serpentine via bar portion 155. MX+1 wire 145 (including wire portion 150 and Via bar portion 155) is offset toward MX wire 140. MX wire 140 is spaced distance Dcrit from via bar portion 155 of MX+1 wire 145 along the entire length of the via bar portion.

From FIGS. 6B and 6C, it can be seen that MX wire 140 is formed in lower dielectric layer 120 and MX+1 wire 145 (including wire portion 150 and via bar portion 155) is formed in upper dielectric layer 125. In FIG. 6C, a top surface 157 of MX wire 140 is coplanar with a bottom surface 158 of via bar portion 155 of MX+1 wire 145. Dcrit is the distance between MX wire 140 and via bar portion 155 of MX+1 wire 145 along the interface between lower dielectric layer 120 and upper dielectric layer 125. When dielectric layers 120 and 125 comprise multiple dielectric layers, the interface of interest is the interface between the uppermost dielectric layer of lower dielectric layer 120 and the lowermost dielectric layer of upper dielectric layer 125.

FIG. 6D illustrates a variation of FIG. 6C wherein via bar portion 155 of MX+1 wire 145 extends into lower dielectric layer 120 so top surface 157 of MX wire 140 is not coplanar with bottom surface 158 of via bar portion 155 of MX+1 wire 145. However, Dcrit is still measured along the interface between lower dielectric layer 120 and upper dielectric layer 125. FIG. 6E illustrates a variation of MX+1 wire 145. In FIGS. 6A and 6C, the widths of wire portion 150 and via bar portion 155 of MX+1 wire 145 are the same, while in FIG. 6E the width of wire portion 150 is greater than the width of via bar portion 155 of MX+1 wire 145. Dcrit is still measured along the interface between lower dielectric layer 120 and upper dielectric layer 125.

FIGS. 7A and 7B illustrate placement of TDDB test structures according to embodiments of the present invention in integrated circuit chips. In FIG. 7A, an integrated circuit chip 200A includes a functional circuit area 205 and a kerf area 210 where test and monitor structures are placed and which form the streets for singulating individual chips from a wafer. In FIG. 7A, a set of TDDB monitor regions 215A, 215B, 215C, and 215D are placed in kerf area 210. Each of the TDDB monitor regions contains sets of two or more TDDB test structures according to the embodiments of the present invention wherein Dcrit is varied between about Dmin and about 0.5×Dmin or less. There may be one or more such sets corresponding to one or more wiring levels. This configuration is suitable for measurement only at wafer level since singulation will destroy the TDDB monitor regions 215A, 215B, 215C, and 215D.

FIG. 7B is similar to FIG. 7A except TDDB monitor regions 215A, 215B, 215C, and 215D are placed in functional circuit area 205. This configuration is suitable for measurement at either wafer or module level.

FIG. 8 illustrates an un-singulated wafer containing integrated circuit chips having TDDB test structures according to embodiments of the present invention. In FIG. 8, a wafer 220 contains an array 225 of integrated circuit chips 200A or 200B.

FIG. 9 illustrates an integrated circuit chip having TDDB test structures according to embodiments of the present invention mounted to a module. In FIG. 9, an integrated circuit chip 200B is physically mounted to a module (e.g., chip carrier) 230. Integrated circuit chip 200B is electrically connected to module 230 by wire bonds 235. Module 230 includes connectors 240 for temporary connection of module 230 to a burn-in board or other test jig.

Figure 10:
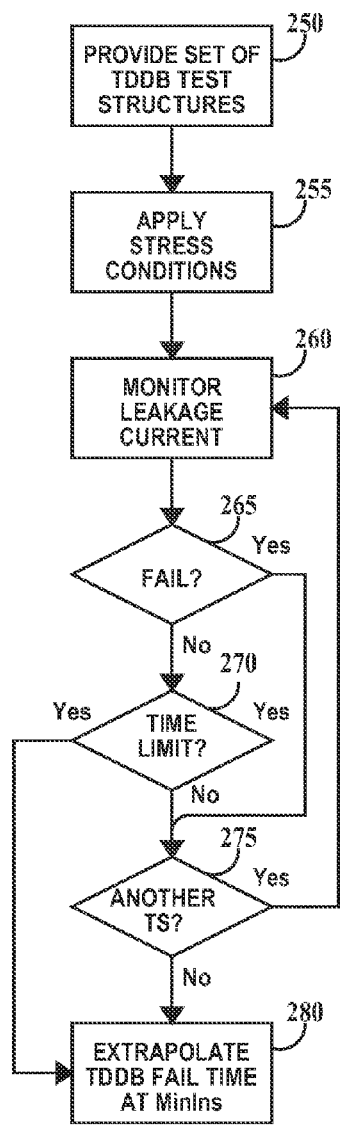
FIG. 10 is a method of determining TDDB behavior using TDDB test structures according to embodiments of the present invention.

FIG. 10 is a method of determining TDDB behavior using TDDB test structures according to embodiments of the present invention. Testing is performed in a stress chamber (if the test is performed at non-ambient temperature, otherwise a test jig can be used) connected to a computer. In step 250, a set of TDDB test structures according to embodiments of the present invention are provided. The Dcrit of each of the TDDB structures is different, ranging between about Dmin (or more) and about 0.5×Dmin (or less) but greater than MinIns. In step 255, the stress conditions are applied to the set of TDDB test structures. In one example, the stress is performed at a preselected temperature (which may be above ambient room temperature, at ambient room temperature or below ambient room temperature) while an electric field is applied to each TDDB test structure. In one example, the stress is performed at a preselected temperature (which may be above ambient room temperature, at ambient room temperature or below ambient room temperature) while an electric field of between about 2 MV/cm and about 7 MV/cm is applied to each TDDB test structure. In one example, the stress is performed at between about 100° C. and about 300° C. while an electric field of between about 2 MV/cm and about 7 MV/cm is applied to each TDDB test structure. In step 260, the leakage current in each TDDB test structure of the set of TDDB test structures is monitored. In step 265, it is determined if any TDDB test structure fails (e.g., a current leakage limit is exceeded). If there is a fail, the fail time is recorded (the leakage current may also be recorded) and the method proceeds to step 275. In step 275, it is determined if there is still a TDDB test structure that has not failed. If there is another TDDB test structure that has not failed, the method loops back to step 260, otherwise the method proceeds to step 280.

Returning to step 265, if there is no fail, the method proceeds to step 270. In step 270 it is determined if the length of time of the stress test has exceeded a preset time limit. If preset time limit has not been exceeded, the method proceeds to step 275, otherwise to step 280. It should be understood that steps 265 and 270 are performed periodically while step 260 is performed. Step 270 is optional and testing could proceed until all TDDB test structures of the set of TDDB test structures have failed and step 265 would connect directly to step 275. In step 280, the stress test is complete and the time to fail at MinIns is extrapolated from the time of fail of the TDDB test structures. There is no direct measurement of the time to fail for a structure at MinIns because it is not possible to build such a structure. Remember Dmin>Dcrit>MinIns. The extrapolation may be done by curve fitting or a computer model may be used.

Figure 11:
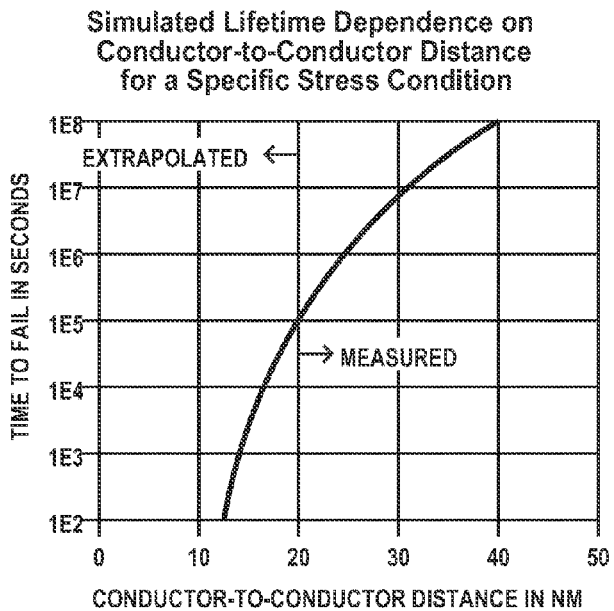
FIG. 11 is chart illustrating step 280 of FIG. 10.

FIG. 11 is chart illustrating step 280 of FIG. 10. FIG. 11 should be considered exemplary. The FIG. 11 chart is a simulation of a plot of time to fail in seconds versus conductor-to-conductor distance along the dielectric layers interface in nm. The curve was generated using a square root electric field (SQRT E) model with 65 $(nm/V)^{0.5}$ field acceleration running on a computer. In this example, Dmin is 40 nm. Dcrit is 20 nm and MinIns is 12 nm. Values for time to fail for 20 nm and higher would be inputs to the model from actual measurements. Values for time to fail below 20 nm would be generated by the model.

Thus, the embodiments of the present invention provide structures and methods for determining TDDB reliability at reduced spacings using the structures.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A structure, comprising:
   an upper dielectric layer on a top surface of a lower dielectric layer, a bottom surface of said upper dielectric layer and said top surface of said lower dielectric layer defining an interface;
   a first wire formed in said lower dielectric layer;
   a second wire formed in said upper dielectric layer, said second wire physically and electrically contacting said first wire;
   a third wire formed in said lower dielectric layer, said third wire separated from said first wire only by a region of said lower dielectric layer between said first wire and said third wire, said first wire spaced a first distance from said third wire in said region of said lower dielectric layer, said second wire formed only over said first wire and said region of said lower dielectric layer, said second wire extending over said region of said lower dielectric layer a second distance, said second distance less than said first distance, said third wire electrically isolated from said first wire and said second wire; and
   wherein said first distance and said second distance are measured in a direction parallel to said interface and wherein said second distance is about 12 nm.

2. The structure of claim 1, wherein a top surface of said first wire is coplanar with a top surface of said lower dielectric layer, a top surface of said third wire is coplanar with said top surface of said lower dielectric layer, and a bottom surface of said second wire is coplanar with a bottom surface of said upper dielectric layer.

3. The structure of claim 1, wherein a top surface of said first wire is coplanar with a top surface of said lower dielectric layer and said second wire extends through said upper dielectric layer and into said lower dielectric layer.

4. The structure of claim 1, wherein a top surface of said first wire is coplanar with a top surface of said lower dielectric layer and said second wire comprises a wire portion and an integral via portion, a top surface of said wire portion coplanar with a top surface of said upper dielectric layer and a bottom surface of via portion is coplanar with a bottom surface of said upper dielectric layer.

5. The structure of claim 4, wherein said via portion is un-landed and does not contact any wire in said lower dielectric layer.

6. The structure of claim 1, wherein a top surface of said first wire is coplanar with a top surface of said lower dielectric layer and said second wire comprises a wire portion and an integral via portion, a top surface of said wire portion coplanar with a top surface of said upper dielectric layer and said via portion extends into said lower dielectric layer.

7. The structure of claim 6, wherein said via portion is un-landed and does not contact any wire in said lower dielectric layer.

8. The structure of claim 1, wherein a top surface of said first wire is coplanar with a top surface of said lower dielectric layer and said second wire comprises a wire portion and an integral via bar portion, a top surface of said wire portion coplanar with a top surface of said upper dielectric layer and a bottom surface of via bar portion is coplanar with a bottom surface of said upper dielectric layer.

9. The structure of claim 8, wherein said via bar portion is un-landed and does not contact any wire in said lower dielectric layer.

10. The structure of claim 1, wherein a top surface of said first wire is coplanar with a top surface of said lower dielectric layer and said second wire comprises a wire portion and an integral via bar portion, a top surface of said wire portion coplanar with a top surface of said upper dielectric layer and said via bar portion extends into said lower dielectric layer.

11. The structure of claim 10, wherein said via bar portion is un-landed and does not contact any wire in said lower dielectric layer.

12. The structure of claim 1, further including:
a less than whole portion of a bottom surface of said second wire abutting a less than whole portion of a top surface of said first wire.

13. The structure of claim 1, wherein said first wire and said second wire include serpentine regions and said first distance between said first wire and said second wire remains constant along the length of said serpentine region of said first wire.

14. The structure of claim 1, wherein said first distance is about 40 nm.

15. The structure of claim 1, wherein said first distance minus said second distance is less than a specified minimum wire-to-wire design spacing of said lower dielectric layer.

16. The structure of claim 1, wherein said first distance is equal to a specified minimum wire-to-wire design spacing of said lower dielectric layer.

17. The structure of claim 1, wherein said first distance is equal to the lithographic resolution limit of a specified fabricating technology.

18. A method, comprising:
providing two or more Time Dependent Dielectric Breakdown (TDDB) test structures, each TDDB test structure comprising:
an upper dielectric layer on a top surface of a lower dielectric layer, a bottom surface of said upper dielectric layer and said top surface of said lower dielectric layer defining an interface;
a first conductor formed in said lower dielectric layer;
a second conductor formed in said upper dielectric layer;
a third conductor formed in said lower dielectric layer, said third conductor separated from said first conductor only by a region of said lower dielectric layer between said first conductor and said third conductor, said first conductor spaced a first distance from said third conductor in said region of said lower dielectric layer, said second conductor formed only over said first conductor and said region of said lower dielectric layer, said second conductor extending over said region of said lower dielectric layer a second distance, said second distance less than said first distance, said third conductor electrically isolated from said first conductor and said second conductor; and
wherein said first distance and said second distance are measured in a direction parallel to said interface,
each of said two or more TDDB test structure having a different first conductor to second conductor distance;
stressing said TDDB test structures at a preselected temperature with an electric field applied between said first and second conductors, measuring a leakage current between said first and second conductors, and recording a time for each TDDB test structure of said two or more TDDB test structures to exceed a preselected leakage current value; and
extrapolating a time to fail of a TDDB test structure having a first conductor to second conductor distance that is less than the smallest distance of said different first conductor to second conductor distances.

19. The method of claim 18, wherein said first conductor comprises a damascene conductor formed in said lower dielectric layer and said second conductor comprises a dual-damascene conductor having a conductor portion and either an integral via portion or an integral via bar portion, said TDDB leakage current is measured between said first conductor and either said via portion or said via bar portion of said second conductor.

20. The method of claim 18, wherein said first conductor, said second conductor and said third conductor are serpentine and facing sides of said first conductor, said second conductor and said third conductor are parallel.

21. The method of claim 18, wherein said first distance minus said second distance is less than a specified minimum wire-to-wire design spacing of said lower dielectric layer.

22. The method of claim 18, wherein said first distance is equal to a specified minimum wire-to-wire design spacing of said lower dielectric layer.

23. The method of claim 18, wherein said first distance is equal to the lithographic resolution limit of a specified fabricating technology.

* * * * *